United States Patent [19]

DeBruyne et al.

[11] 4,177,479

[45] Dec. 4, 1979

[54] ELECTRICAL CIRCUIT WITH A HIGH-FREQUENCY THYRISTOR FIRED BY BLOCKING LEAKAGE CURRENT

[75] Inventors: Patrick DeBruyne, Siggenthal; Roland Sittig, Umiken, both of Switzerland

[73] Assignee: BBC Brown Boveri & Company, Limited, Baden, Switzerland

[21] Appl. No.: 894,033

[22] Filed: Apr. 6, 1978

Related U.S. Application Data

[63] Continuation of Ser. No. 713,484, Aug. 11, 1976, abandoned.

[30] Foreign Application Priority Data

Sep. 9, 1975 [CH] Switzerland ............ 11695/75

[51] Int. Cl.$^2$ ............................................. H01L 29/74
[52] U.S. Cl. ................................. 357/38; 357/20; 357/64; 357/90; 307/252 C; 307/252 N
[58] Field of Search ............ 357/38, 20, 64, 90; 307/252 C, 252 N, 0.5, 324

[56] References Cited

U.S. PATENT DOCUMENTS

| 3,324,359 | 6/1967 | Gentry | 357/38 |
| 3,609,476 | 9/1971 | Storm | 357/38 |
| 3,821,565 | 6/1974 | Horinaga | 307/252 C |

*Primary Examiner*—Joseph E. Clawson, Jr.
*Attorney, Agent, or Firm*—Oblon, Fisher, Spivak, McClelland & Maier

[57] ABSTRACT

A high frequency, high voltage thyristor and an associated circuit arrangement and method of operating the circuit are disclosed. The thyristor, which is capable of switching frequencies above 10 kHz and forward blocking voltages in excess of 500 V. includes an interdigitated emitter-gate structure, a control zone in contact with the gate and a base zone that is less doped than the control zone. The base zone of the thyristor includes first and second layers of different doping concentrations. The circuit arrangement includes thyristors of the type described arranged in pairs and shunted by antiparallel diodes. According to the method of the invention, the thyristor is not fired by applying potential to the gate, but by holding the thyristor in a forward blocking state and then opening the gate circuit or reversing the gate voltage.

4 Claims, 6 Drawing Figures

ELECTRICAL CIRCUIT WITH A HIGH-FREQUENCY THYRISTOR FIRED BY BLOCKING LEAKAGE CURRENT

This is a continuation, of application Ser. No. 713,484, filed Aug. 11, 1976, now abandoned.

BACKGROUND OF THE INVENTION

1. Field of the Invention

The invention relates to an electrical circuit with a thyristor for switching frequencies greater than 10 kHz and forward blocking voltages greater than 500 V, in which the thyristor has an interdigitated emitter-gate structure, a control zone in contact with the gate, and a base zone which is less doped than the control zone. When the thyristor is being turned off, the gate remains at a potential whose polarity is opposite to that of the majority carriers in the control zone, and the control zone does not have any emitter shorts which might short-circuit the PN-junction with the adjacent emitter zone, to the electrode contacting the emitter zone. Further, the invention relates to a method for driving the above-described circuit arrangement.

2. Description of the Prior Art

A circuit arrangement of the type described above is disclosed in Int. J. Electronics 36 (1974), pp. 399–416. Circuits in which such electrical connections can be used are known, for example from Heumann, Stumpe "Thyristors," Teubner-Verlag 1970, pp. 131–133, or Penkowski, Pruzinsky "Fundamentals of a pulse Width Modulated Power Circuit" Power Semiconductor Applications, IEEE Press 1972, pp. 266–275, or "Silicon Rectifier Handbook," Aktiengesellschaft Brown, Boveri & Cie., Baden (Switzerland), 1971, pp. 197–201.

The thyristor disclosed in Int. J. Electronics 36 (1974), pp. 399–416, has recovery (turn-off) times of less than 2 $\mu$sec, a permissible voltage gradient $du/dt = 600$ V/$\mu$sec, a forward and reverse blocking voltage of 650 V, and a switching frequency of 100 kHz.

The low recovery (turn-off) time is substantially attained through the above-described control of the gate. The negative (in the case of a P-control zone) potential at the gate causes the charge carriers of the ON-condition, which is to be switched to the OFF-condition, to be cleared from the control- and base-zones more quickly. This principle is also known as "gate-assisted turn-off" (GATO). However, this principle entails the danger that, in the case of larger diameters of the semiconductor component to be switched to the OFF state, the current may be "crowded" into a channel of small diameter, and cause overheating and damage there. In order to prevent this, the interdigitated emitter-gate structure is provided, by means of which the negatively polarized gate can rapidly act on all parts of the P-control zone. A high conductivity of the P-control zone is also of assistance in this context. Emitter shorts which short circuit the PN-junction between the control zone and emitter zone on the cathode side (in the case of a P-control zone), should not be provided in this case, as otherwise the negatively polarized gate would be without effect. Indeed, the P-N junction must have a sufficiently good blocking ability, as this ability restricts the possible negative potential at the gate.

The interdigitated emitter-gate structure is not only useful for turning the thyristor off, but is also of great importance for turning it to the ON state, as only in this way can firing, proceeding from the gate, sufficiently quickly reach all the active parts of the thyristor. Otherwise there would be unacceptably high switching losses and too low permissible current rise times.

In this connection it is true that appreciable limitations are imposed due to the requirement for high firing currents for the purpose of uniformly firing the long cathode edge, and also to the need for very small cathode strip widths. If the whole cathode surface is to be fired within one $\mu$sec, firing currents of the order of magnitude of the forward current in the ON state of the thyristor would be needed, as would cathode strip widths of only about 300 $\mu$m. However, this would entail the loss of so much active surface that this expedient does not appear to be suitable in practice.

The electrical circuit layout disclosed in Int. J. Electronics 36 (1974) pp. 399–416, is also not suitable for higher blocking voltages, for example, those over 1000 V. This is because high blocking voltages require a thick, high-ohmic base zone in the thyristor. However, such a base zone prevents sufficiently rapid clearing of the charge carriers from the ON state, if—through the incorporation of recombination centres (for example, gold doping)—the lifetime of the charge carriers is not to be appreciably shortened. However, again, such recombination centres cause an unacceptably high (thyristor) ON state voltage drop.

SUMMARY OF THE INVENTION

Accordingly, it is one object of the present invention to so improve the known circuit layout that the latter permits, with minimal recovery time and small turn-on losses, high forward blocking voltages and large values of the permissible current and voltage rise speeds.

Briefly, according to the invention this and other objects and advantages are achieved by providing, in the circuit layout described above, a thyristor with a base zone consisting of two layers, of which the layer lying adjacent to the control zone is less heavily doped than the other layer.

This expedient is known per se from IEE Conference Publication 123, London, Dec. 3, 1974, pp. 13–19. By means of this expedient it is possible to appreciably reduce the thickness of the base zone while the forward blocking voltage remains unreduced. The high-ohmic layer of the base zone is then completely emptied of free charge carriers at relatively low voltages, while the low-ohmic layer avoids a further extension of the blocking layer and, thus, a "punch-through" (barrier layer contact breakdown). Thus, control and base-zones together approximately form a PIN-structure, in which a rectangular field distribution is obtained instead of a triangular field distribution.

If the more highly doped layer of the base zone is directly followed by the highly doped second emitter zone—that is to say the anode layer in the case of a N-doped base zone—then the whole structure is particularly simple to manufacture. However, this structure is only capable of blocking very low voltages in the backward direction, for example 25 V; however, this is not disadvantageous for circuits used in practice, because the thyristor has, in any case, to be shunted, in the reverse blocking direction, by an anti-parallel diode (cf. the literature cited above concerning the known circuits).

The electrical circuit layout according to the invention makes particularly favorable operation possible, and this constitutes a further feature of the invention, which affords unforeseen and surprising advantages.

The method of the invention is characterized in that, in the case of the electrical circuit layout according to the invention, the potential of the gate during the forward blocking state of the thyristor is such that the PN-junction between the control zone and the contiguous emitter zone is biased in the blocking direction and, for firing the thyristor, the potential of the gate has to be brought to zero or to a value of the opposite polarity.

In accordance with this method, the thyristor is not (as has hitherto been usual) fired by applying a potential to the gate, which would otherwise be substantially neutral, but the thyristor—which can be fired by breakover at a low voltage, with the gate circuit open—is held blocked, in the forward condition, by way of the gate, and is then caused to fire by opening the gate circuit or by reversing the potential at the gate. In this way not only are the advantages inherent in the electric circuit proposed according to the invention and described above realized, but also an extremely rapid firing of the whole active part of the thyristor is achieved. This is because firing is not triggered now by laterally flowing gate firing currents, but by the axially flowing blocking current, which is caused by the presence of the space charge layer in the high-ohmic layer of the base zone. The ease with which this thyristor is fired is further assisted by the absence of emitter short-circuits which, although a disadvantage in other circumstances, is advantageous in the method proposed according to this invention.

The efficient way in which the method proposed according to the invention can be implemented in practice was not at all foreseeable, because the blocking current used for firing the thyristor is markedly temperature-dependent. However, it has been found—and this will be further demonstrated in the following disclosure—that this temperature dependence is not harmful in practice because the generation current at the PN-junction between the control zone and the contiguous emitter zone has, to a large extent, the same temperature-dependence.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
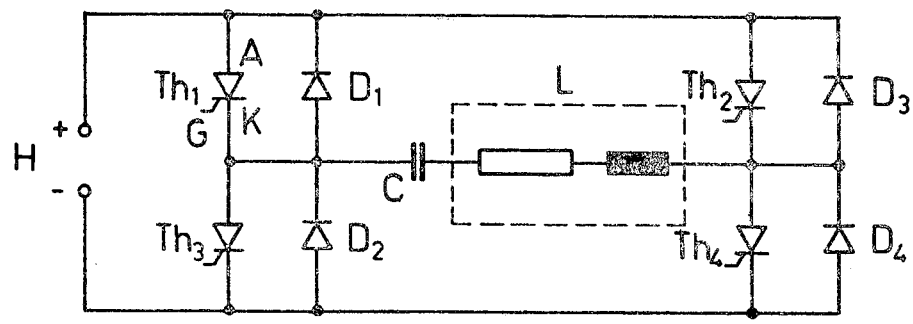
FIG. 1 is a schematic diagram of a high frequency load-controlled inverter circuit with connections according to the invention.

Referring now to the drawings, wherein like reference numerals designate identical or corresponding parts throughout the several views, and more particularly to FIG. 1 thereof, a load-controlled inverter is shown with series-oscillating circuit load RLC, for example a high-frequency induction furnace L with series capacitance C. FIG. 1 also shows the thyristors $Th_1$, $Th_2$, $Th_3$, $Th_4$ connected according to the invention. These are shunted, in the reverse blocking direction by antiparallel diodes $D_1$, $D_2$, $D_3$, $D_4$. The illustrated circuit may be employed as an intermediate circuit inverter, the d.c. input voltage being fed from the d.c. intermediate circuit at H.

Figure 2:
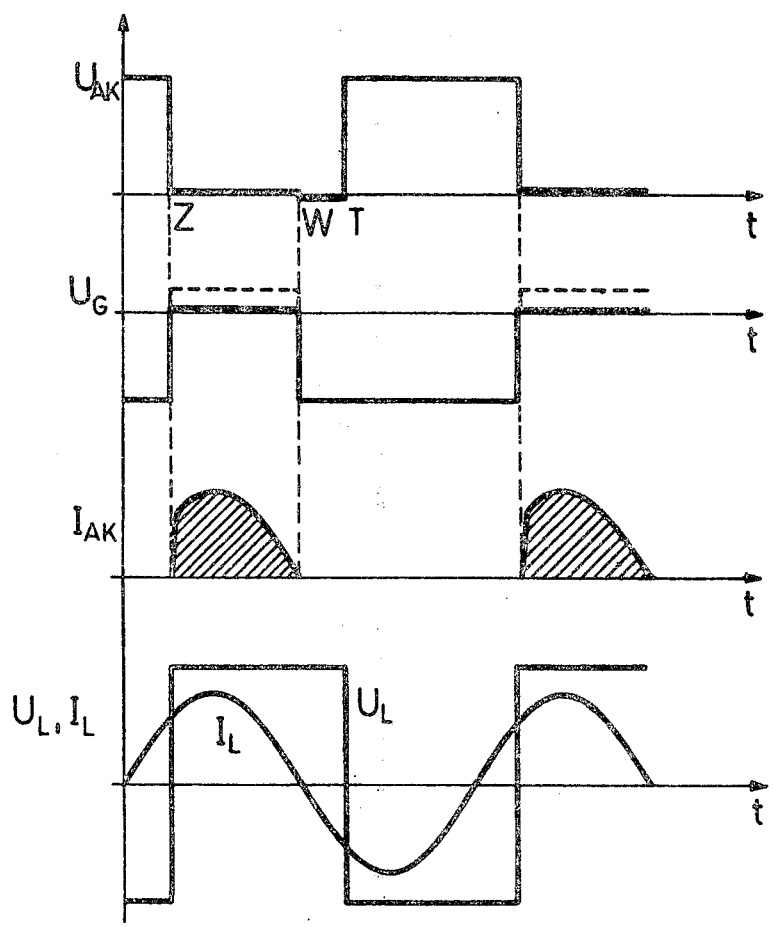
FIG. 2 is a graphical diagram showing voltages and currents in the circuit of FIG. 1.

As is clear from FIG. 2, the voltage $U_{AK}$ is applied to the main connections of each thyristor $Th_1$–$Th_4$. Control voltage $U_G$ is applied to the gate connection G, the pulse form of this voltage being shown in FIG. 2 for a thyristor having a P-control zone and N-base. $U_G$ is initially negative so that the thyristor is blocked. If, at time point Z, the gate voltage $U_G$ is brought to zero or to a positive value, for example at the switching connections of thyristors $Th_1$ and $Th_4$, this pair of thyristors is fired, and the current $I_{AK}$ flows through $Th_1$ and $Th_4$. This current $I_{AK}$ reverses its sign at time point W. The current $I_{AK}$ must then be guided through the anti-parallel diodes $D_1$ and $D_4$ until, at time point T, the thyristor pair $Th_2$ and $Th_3$ is fired and conducts the current. At this time the voltage $U_{AK}$ once again rises at the switching connections of thyristors $Th_1$ and $Th_4$. For blocking this voltage, the gates G of $Th_1$ and $Th_4$ must be restored to negative potential during the time interval W to T.

In this way a rectangular a.c. voltage $U_L$ is present at the load L, as is also the alternating current $I_L$, phase shifted with respect to this a.c. voltage.

Through the use of thyristor switching connections according to the invention, inverters can be equipped with semiconductor components at frequencies of a magnitude at which it has only been possible to employ electron tubes previously.

Figure 3:
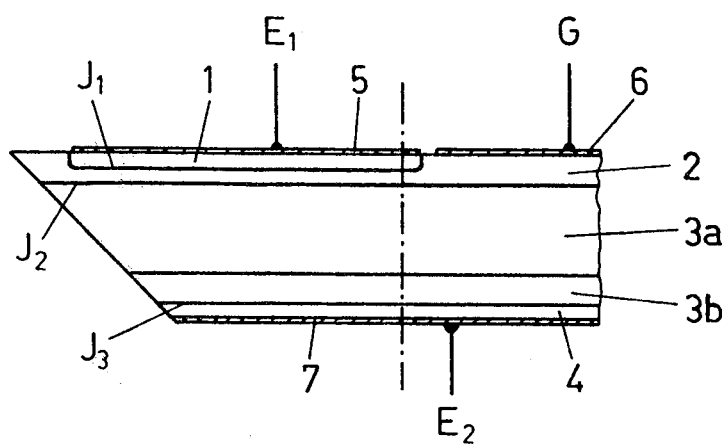
FIG. 3 is a partially broken away cross section taken through a thyristor according to the invention, along line s—s of FIG. 4, with a positive slope of the forward blocking PN-junction.

The thyristor shown in cross-section in FIG. 3 comprises: a first emitter zone 1; a control zone 2; a base zone with a high-ohmic layer 3a and a low-ohmic layer 3b; a second emitter zone 4 and a first main electrode 5; a gate electrode 6, and a second main electrode 7. The PN-junctions $J_1$, $J_2$, $J_3$ lie between the zones 1/2, 2/3a, 3b/4. The connection to the main electrode 5 is designated as $E_1$, the connection to the main electrode 7 as $E_2$, and the connection to the gate electrode 6 as G.

As the PN-junction $J_3$ does not have to support a blocking voltage, it is possible to provide, at the forward blocking PN-junction $J_2$, the positive slope which, as is known, is particularly favorable (IEEE Trans. ED-11 (1964) 313).

Figure 4:
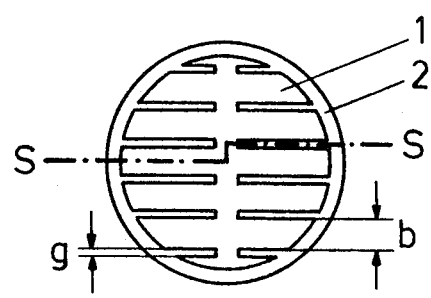
FIG. 4 is a plan view of the gate side of the thyristor shown in FIG. 3.

It can be seen from FIG. 4 that the thyristor shown in FIG. 3 has an interdigitated emitter-gate structure. The strip width of the emitter zone 1 is indicated as b, the strip width or control zone 2 as g.

Dimensioning Examples

Relatively high power (dissipation) losses occur in a continuously operating high-frequency thyristor. An operating temperature of 370° K. is therefore used as a basis for dimensioning.

Epitaxy N-base thyristor

Figure 5:
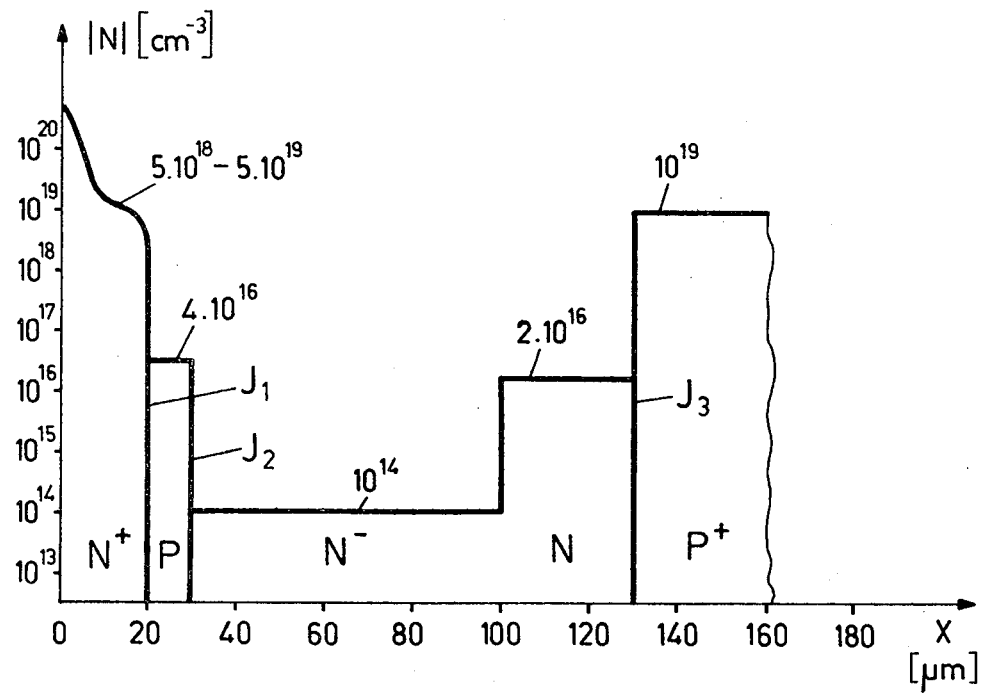
FIG. 5 shows the doping profile for a thyristor having an N-doped base zone; and, FIG. 6 shows the doping profile for a thyristor having P-doped base zone.

FIG. 5 shows the doping pattern (value of doping concentration N plotted as a function of distance x from the end surface) for a thyristor which is made by means of epitaxy on a P+-substrate. This thyristor has the following layers:

P+-substrate (corresponding to the second emitter zone 4 in FIG. 3): acceptor concentration $N_A=10^{19}$ cm$^{-3}$, the layer thickness is not important for operation but, for example, it may be 300 μm.

N-layer (corresponding to layer 3b in FIG. 3); donor concentration $N_D=2\cdot10^{16}$ cm$^{-3}$, layer thickness 30 μm.

N$^-$-layer (corresponding to layer 3a in FIG. 3): donor concentration $N_D=1\cdot10^{14}$ cm$^{-3}$, layer thickness 70 μm.

P-layer (corresponding to control zone 2 in FIG. 3); acceptor concentration $N_A=4\cdot10^{16}$ cm$^{-3}$, layer thickness 10 μm.

N+-layer (corresponding to the first emitter zone 1 in FIG. 3) with alloyed metallization (5/6 in FIG. 3); Donor concentration $N_D$ in the range $5\cdot10^{18}$–$5\cdot10^{19}$ cm$^{-3}$, layer thickness 10–20 μm. This N+-layer can also be produced by a process of diffusion into a correspondingly thicker p-layer.

For reducing the lifetime of the injected charge carriers, gold is diffused, in a known manner, into the layers 3a, 3b to a concentration of about $6\cdot10^{13}$ cm$^{-3}$, so that a lifetime of 0.7 μsec results.

The voltage $U_p$, at which the whole N$^-$-layer 3a is cleared of free charge carriers=400 V. The maximum field strength for silicon of $2\cdot10^5$ V/cm is reached at the PN$^-$ junction J$_2$ at a forward blocking voltage of $U_B=1000$ V. The breakdown voltage of the NP+-junction J$_3$ in the reverse direction is 35 V. The N+P-junction J$_1$ between control zone 2 and emitter zone 1 can support a maximum of 20 V.

The cathode E$_1$ injects electrons into the P-base 2 if the current density over the N+-junction J$_1$ is greater than the generation current at this junction. With increasing blocking voltage at junction J$_2$, the blocking current gradually exceeds the generation current of J$_1$ and, as soon as the forward blocking voltage exceeds 130 V, the thyristor can be uniformly fired solely by opening the gate circuit. This value is practically independent of temperature, as the blocking current and the generation current at the N+-junction J$_1$ exhibit almost the same temperature-dependence. At 370° K. the minimum firing current density amounts to 3 mA/cm$^2$, and the maximum blocking current density amounts to 20 mA/cm$^2$ at a forward voltage of 1000 V.

If a homogeneous current density j from the N$^-$-region 3a flows into the P-layer 2, and is drawn off beneath the cathode strips of width b, to the gate, there will be a maximum voltage drop of $U=J\rho b^2/8d$. In this expression d stands for the thickness and $\rho$ represents the specific resistance of the P-layer 2. From this it is clear that, in the case of a negative gate voltage of 10 V and of a strip width of 2 mm, a maximum current density of 4 A/cm$^2$ can be drawn off, without the cathode E$_1$ injecting electrons. This value is 300 times greater than the maximum blocking current density, so that firing is always reliably controlled by the blocking current. The maximum current density which can be drawn off by way of gate G must be so great that, even where the base 3a/3b is flooded about twenty-fold, a du/dt of 1000 V/μsec can be maintained. The recovery time of this thyristor then still amounts to 1.5 to 2 μsec.

The above-described thyristor may, for example, be operated on the basis of the following data:
Periodic peak blocking voltage—800 V
Maximum continuous current—100 A
Critical voltage gradient—2000 V/μs
Critical current gradient—200 A/μs
Switching frequency—50 kHz
Electrical potential at the gate when blocking occurs: −10 V, and (on firing) 0 to 1 V.

P-base thyristor

Figure 6:
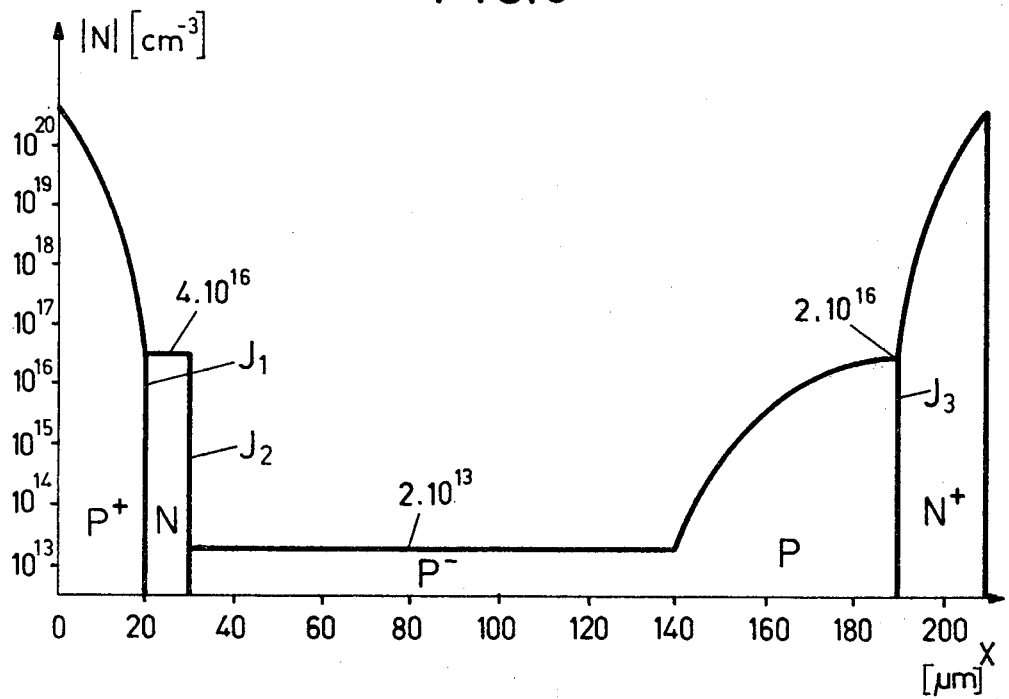

FIG. 6 illustrates the doping pattern for a P-base thyristor. Manufacturing starts from a silicon slice of about 200 μm thick, with a P-doping concentration of $2\cdot10^{13}$ cm$^{-3}$ (700Ω cm). From one side a P-profile of about 70 μm depth and an N+-zone are diffused. On the other side a N-layer of about 30 μm thickness is epitaxially applied with a doping of $4\cdot10^{16}$ cm$^{-3}$, into which layer a P+-profile is then diffused. Into the whole sample gold is diffused up to a concentration of $6\cdot10^{13}$ cm$^{-3}$, so that a lifetime of 0.7 μsec results.

The P+-layer, the N-layer, the P$^-$-layer, the P-layer and the N+-layer correspond, in the same order of sequence, to the zones 1, 2, 3a, 3b, 4 of the thyristor shown in FIG. 1.

With a forward voltage of 200 V, the blocking layer extends through the whole P$^-$-layer 3a. If the forward voltage rises further, this blocking layer will, of course, extend, by a further distance of up to 20 μm, into the following P-layer 3b. The maximum forward blocking voltage amounts to 2200 V. As in the previous example, the breakdown voltages of the P+N-junction and of the PN+-junction (J$_1$ and J$_3$ respectively) amount to 20 and 35 V respectively.

The minimum forward voltage for breakover firing now amounts to 30 V. This reduction is achieved by the greater distance, as a consequence of the lesser degree of doping, of the blocking layer at the PN-junction J$_2$. The maximum blocking current density at a forward voltage of 2200 V and at an operating temperature of 370° K. now amounts to 55 mA/cm$^2$.

The conductivity in the 10 μm thick N-layer 2 is almost three times as great as in the P-layer 2 of the foregoing example. The cathode strip width b can now therefore be increased, by a factor $\sqrt{3}$ to b=3.3 mm.

For the thyristor of this example the recovery time will be about 3 μsec.

The operating data of the thyristor of this example are, for example, as follows:
Periodic peak blocking voltage—1500 V
Maximum continuous current—100 A
Critical voltage gradient—1000 V/μs
Critical current gradient—200 A/μs
Switching frequency—30 kHz
Potential of the gate when blocking occurs=+10 V and, when firing occurs=0 to −τV.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of operating a thyristor circuit which includes a load and at least one thyristor in series connection with said load, using biasing means which subjects said thyristor to an alternating current having a frequency greater than 10 kHz and a voltage greater than 500 V, and a gate circuit for applying predetermined potentials to said thyristor to selectively fire said thyristor, comprising the steps of:

providing said at least one thyristor with an emitter zone and a gate in the form of an interdigitated emitter-gate structure, a control zone in contact with said gate, a base zone which is doped to a lesser extent than the control zone and an anode zone, said control zone being free from any short circuits to an electrode in contact with said emitter zone bridging the PN-junction between said control and said emitter zones, and said base zone consisting of first and second layers, said first layer being adjacent said control zone and doped to a lesser extent than said second layer;

connecting said biasing means across said emitter and anode zones of said at least one thyristor;

maintaing the electrical potential of said gate during the forward blocking state of the thyristor such that the PN-junction between the control zone and the contiguous emitter zone is polarized in the blocking direction, said biasing means generating a leakage current in said forward blocking state;

firing said thyristor during a positive load current period by means of said leakage current by setting the potential of said gate to a value between and including zero and the opposite of the potential of the gate during the forward blocking state; and setting the potential of said gate again to the value of the forward blocking state after said alternating current turns to its negative load current period.

2. A method as in claim 1, wherein:

said step of firing includes the step of reducing the potential of said gate to zero and maintaining the potential of said gate at zero.

3. A method as in claim 1, wherein:

said step of firing is performed by reversing the potential of said gate.

4. A method of operating a thyristor circuit which includes a load and at least one thyristor in series connection with said load, using biasing means which subjects said thyristor to an alternating current having a frequency greater than 10 kHz and a voltage greater than 500 V, and a gate circuit for applying predetermined potentials to said thyristor to selectively fire said thyristor, comprising the steps of:

providing said at least one thyristor with an emitter zone and a gate in the form of an interdigitated emitter-gate structure, a control zone in contact with said gate, a base zone which is doped to a lesser extent than the control zone and an anode zone, said control zone being free from any short circuits to an electrode in contact with said emitter zone bridging the PN-junction between said control and said emitter zones, and said base zone consisting of first and second layers, said first layer being adjacent said control zone and doped to a lesser extent than said second layer;

connecting said biasing means across said emitter and anode zones of said at least one thyristor;

maintaining the electrical potential of said gate during the forward blocking state of the thyristor such that the PN-junction between the control zone and the contiguous emitter zone is polarized in the blocking direction, said biasing means generating a leakage current in said forward blocking state;

firing said thyristor during a positive load current period by means of said leakage current by opening the gate circuit; and setting the potential of said gate again to the value of the forward blocking state after said alternating current turns to its negative load current period.

* * * * *